(12) United States Patent
Sasaki et al.

(10) Patent No.: US 8,269,294 B2
(45) Date of Patent: Sep. 18, 2012

(54) SPIN TRANSPORT DEVICE

(75) Inventors: Tomoyuki Sasaki, Tokyo (JP); Tohru Oikawa, Tokyo (JP); Katsumichi Tagami, Saku (JP); Masaki Kubota, Tokyo (JP)

(73) Assignee: TDK Corporation, Tokyo (JP)

( * ) Notice: Subject to any disclaimer, the term of this patent is extended or adjusted under 35 U.S.C. 154(b) by 154 days.

(21) Appl. No.: 12/796,034

(22) Filed: Jun. 8, 2010

(65) Prior Publication Data

US 2010/0314702 A1  Dec. 16, 2010

(30) Foreign Application Priority Data

Jun. 10, 2009  (JP) ................. P2009-139248

(51) Int. Cl.
*H01L 29/82* (2006.01)
*G11C 11/02* (2006.01)

(52) U.S. Cl. ......... 257/421; 257/427; 438/3; 360/324.2; 360/313; 365/157; 365/158; 365/171; 365/173

(58) Field of Classification Search .......... 257/421–427; 438/3; 365/157–158, 171–173; 360/324–326, 360/313
See application file for complete search history.

(56) References Cited

U.S. PATENT DOCUMENTS

| 7,342,244 | B2 * | 3/2008 | Kaushal et al. | 257/24 |
| 7,608,901 | B2 * | 10/2009 | Koo et al. | 257/421 |
| 2005/0282379 | A1 * | 12/2005 | Saito et al. | 438/624 |
| 2006/0118839 | A1 * | 6/2006 | Sugahara et al. | 257/295 |

FOREIGN PATENT DOCUMENTS

| JP | A-2007-299467 | 11/2007 |
| JP | B2-4029772 | 1/2008 |

OTHER PUBLICATIONS

Marukame, T. et al., "Electrical Characterization of Spin-Injection Structure Using CoFeB/Tunnel Barrier Electrodes for Si," The 56th Spring Meeting, The Japan Society of Applied Physics and Related Societies at Tsukuba University, 2009, p. 790 (with translation).
Ando, Y. et al., "Electrical injection and detection of spin-polarized electrons in silicon through an $Fe_3Si/Si$ Schottky tunnel barrier," *Applied Physics Letters*, 2009, pp. 182105-1 to 182105-3, vol. 94, published by The American Institute of Physics, USA.

* cited by examiner

*Primary Examiner* — Jami M Valentine
(74) *Attorney, Agent, or Firm* — Oliff & Berridge, PLC

(57) ABSTRACT

A spin transport device is provided, which includes a channel comprised of a semiconductor material, a magnetization fixed layer arranged on the channel via a first insulating layer, a magnetization free layer arranged on the channel via a second insulating layer, and first and second electrodes arranged on the channel, wherein carrier densities of a first region of the channel including a contact surface with the first insulating layer, a second region of the channel including a contact surface with the second insulating layer, a third region of the channel including an opposite surface to the first electrode, and a fourth region of the channel including an opposite surface to the second electrode are higher than an average carrier density of the whole channel. Accordingly, a spin transport device that can realize good spin transportation and electric resistance characteristics while suppressing the scattering of spin can be provided.

14 Claims, 10 Drawing Sheets

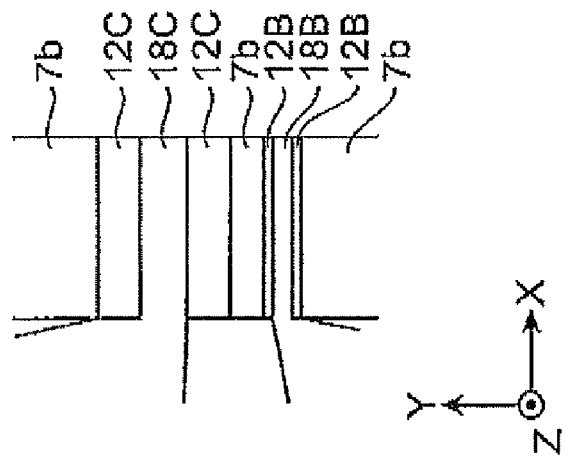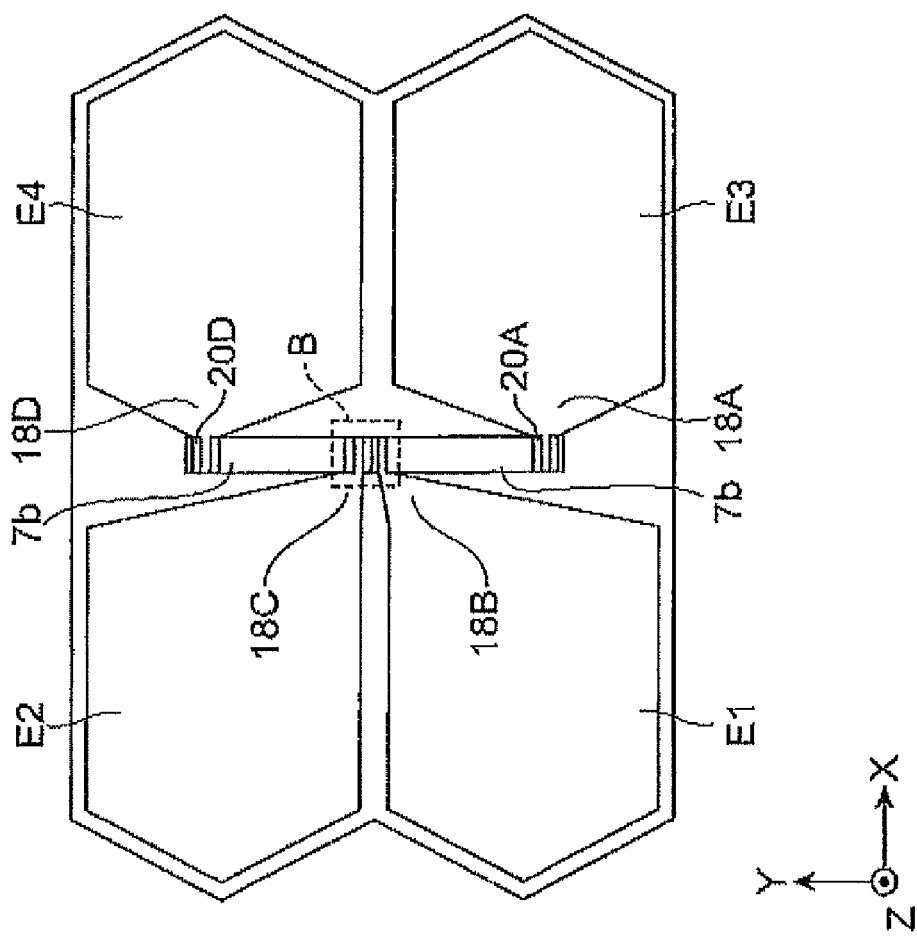

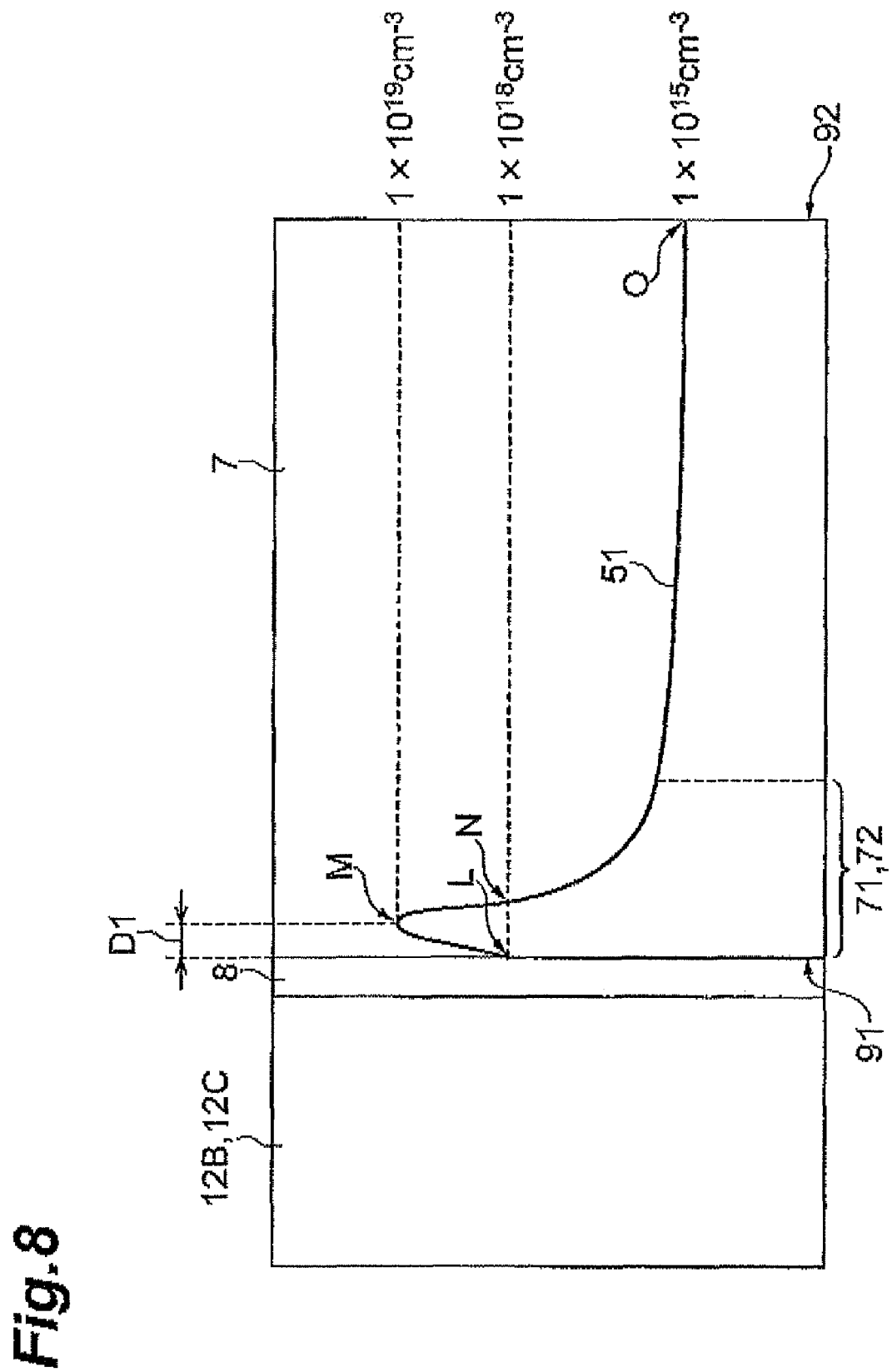

SPIN TRANSPORT DEVICE

BACKGROUND OF THE INVENTION

1. Field of the Invention

The present invention relates to a spin transport device using a spin-dependent transport phenomenon.

2. Related Background Art

A spin transport device in which a magnetization free layer and a magnetization fixed layer are formed on a channel layer for accumulating or transporting spin is known. Recently, a spin transport device in which a semiconductor material is used for a channel layer is attracting a lot of attention instead of a spin transport device in which a metal material is used for a channel layer (for example, see Japanese Unexamined Patent Application Publication No. 2007-299467 and Japanese Patent No. 4029772). The spin transport device in which the semiconductor material is used for the channel layer has a spin diffusion length that is longer than that of the spin transport device in which the metal material is used for the channel layer.

SUMMARY OF THE INVENTION

The conductivity of a semiconductor material is different from the conductivity of a ferromagnetic material. Accordingly, if a Schottky junction is made between a channel layer formed of a semiconductor material, and a magnetization fixed layer or a magnetization free layer formed of a ferromagnetic material, it becomes the cause of a great difference due to the instability of the junction interface.

Also, in the case where the semiconductor material is used for the channel layer, impurities for giving one conduction type to the semiconductor material are injected (For example, see non-patent document: Marukame Takao, Sugiyama Hideyuki, Inokuchi Tomoaki, Ishikawa Mizue, and Saito Yoshiaki in Corporate R and D Center center, Toshiba Corp., "Electrical characterization of spin-injection structure using CoFeB/tunnel barrier electrodes for Si", The Japan Society of Applied Physics, The 56th Ouyoubutsurigaku kannakeirengou kouennkai kouenn yokousyuu, 2009 Spring, University of Tsukuba, pp. 790, 1p-TB-21). In the case where the channel layer is of an n-type, for example, P is injected, while in the case where the channel layer is of a p-type, for example, B is injected.

As the carrier density of the channel layer becomes lower, the transport of spin is facilitated. That is, as the electric resistance of a spin transport device becomes higher, the transport of spin is facilitated. On the other hand, as the electric resistance of a spin transport device becomes lower, the injection of spin is facilitated, and thus high speed and energy saving can be promoted. Thus, in realizing a spin transport device that can promote the high speed and energy saving as it maintains good spin transportation, there is a conflict in the electric resistance characteristics of the spin transport device.

Accordingly, an object of the invention is to provide a spin transport device which can realize good spin transportation and electric resistance characteristics while suppressing the scattering of spin.

In order to solving the object of the present invention, there is provided a spin transport device, which includes a channel comprised of a semiconductor material; a magnetization fixed layer arranged on the channel via a first insulating layer; a magnetization free layer arranged on the channel via a second insulating layer; and first and second electrodes arranged on the channel; wherein carrier densities of a first region of the channel including a contact surface with the first insulating layer, a second region of the channel including a contact surface with the second insulating layer, a third region of the channel including an opposite surface to the first electrode, and a fourth region of the channel including an opposite surface to the second electrode are higher than an average carrier density of the whole channel.

By connecting the magnetization fixed layer and the first electrode with a current source, current flows into the magnetization fixed layer. By making current flow into the magnetization fixed layer, electrons having spin whose direction corresponds to a direction of magnetization of the magnetization fixed layer can be injected into the channel. A voltage output which occurs between the channel and the magnetization free layer can be detected by a voltmeter connected between the magnetization free layer and the second electrode.

According to the spin transport device of an embodiment of the present invention, the first region including the contact surface with the first insulating layer, the second region including the contact surface with the second insulating layer, the third region including the opposite surface to the first electrode, and the fourth region including the opposite surface to the second electrode are provided inside the channel so that the first to fourth regions have the carrier densities which are higher than the average carrier density of the whole channel. Also, the magnetization fixed layer is provided on the first insulating layer, and the magnetization free layer is provided on the second insulating layer. Since the carrier density is relatively high in the first to fourth regions as described above, their electric resistance is relatively low. Thus, the conductivity of the magnetization fixed layer and the magnetization free layer and the conductivity of the channel are easily adjusted, and thus the scattering of spin on the junction interface between the channel and the first or second insulating layer can be suppressed. Accordingly, current and spin from the magnetization fixed layer are easily injected into the channel through the first insulating layer. Also, spin from the channel is easily injected into the magnetization free layer through the second insulating layer. Thereby, the high speed and energy saving of the spin transport device can be promoted.

Further, since the carrier density is relatively low in regions except for the first to fourth regions of the channel, the electric resistance therein is relatively high. Accordingly, by using the corresponding region having a relatively high electric resistance as a spin transport path, the spin is easily transported. As a result, good spin transportation and electric resistance characteristics can be realized as the scattering of spin is suppressed.

The carrier density means the density of majority carrier that exists in the channel. In the case where the channel is of an n-type, the carrier density is the electron density. In the case where the channel is of a p-type, the carrier density is the hole density. The carrier density may be measured by, for example, a hole effect measurement apparatus or a Seebeck coefficient measurement apparatus. In this case, at room temperature, the carrier density is almost equal to the density of impurities injected into the semiconductor material.

Also, it is preferable that the maximum carrier density in each of the first to fourth regions is set to $1\times10^{19}$ to $1\times10^{21}$ $cm^{-3}$. If the maximum carrier density in each of the first to fourth regions is within this numerical value range, the electric resistance in the respective corresponding regions can be lowered effectively. Thus, the conductivity inconsistency between the magnetization fixed layer, and the magnetization free layer and the channel can effectively be reduced. Accordingly, on the junction interface between the channel and the magnetization fixed layer or the magnetization free layer, which are made via the first or second insulating layers, the scattering of spin can effectively be suppressed. Accordingly, the high speed and energy saving of the spin transport device can effectively be promoted.

Also, it is preferable that the average carrier density of the whole channel is set to $1\times10^{16}$ to $1\times10^{20}$ cm$^{-3}$. If the average carrier density of the whole channel is within this numerical value range, the electric resistance in a spin flow or current path can be set to be relatively high, and the spin in the channel is much more easily transported.

Also, it is further preferable that the average carrier density of the whole channel is set to $1\times10^{18}$ to $1\times10^{20}$ cm$^{-3}$. If the average carrier density of the whole channel is within the corresponding numerical value range, the spin in the channel is easily transported.

Also, it is preferable that in the first and second regions, respectively, a depth, at which the carrier density becomes the maximum from the contact surface, is equal to or smaller than 10 nm, and in this case, better spin transportation is obtained.

Also, it is preferable that in the third and fourth regions, respectively, a depth, at which the carrier density becomes the maximum from the opposite surface, is equal to or larger than 10 nm, and in this case, high speed and energy saving of the spin transport device can effectively be promoted.

Also, it is preferable that the spin transport device according to an embodiment of the present invention further includes a third insulating layer and a lower electrode, wherein the third insulating layer is provided on the lower electrode, and the channel is provided on the third insulating layer. By applying a voltage to the lower electrode, charge can be induced in the channel. Accordingly, the spin diffusion length in the channel can be adjusted. In accordance with a relative angle between a magnetization direction of the magnetization free layer in which a magnetization direction is changed by an external magnetic field and a magnetization direction of the magnetization fixed layer, a voltage output occurs between the magnetization free layer and the channel. By lengthening the spin diffusion length, the voltage output can be increased, and further, by providing the lower electrode, an electric field or a magnetic field may be produced in the channel. Accordingly, the electric field or the magnetic field can be applied from the lower electrode to the spin flow or the current that flows between the magnetization free layer and the magnetization fixed layer, and thus it is possible to adjust the polarization direction of the spin. Also, when spin is transported through the channel, spin is scattered by the impurities in the channel. Accordingly, in the case of adjusting the carrier density of the channel, good characteristics can be obtained through the charge adjustment by the electric field, rather than the adjustment by ion injection.

It is also preferable that the spin transport device according to an embodiment of the present invention further includes a fourth insulating layer provided on the channel between the first insulating layer and the second insulating layer and an upper electrode provided on the fourth insulating layer. By applying a voltage to the upper electrode, charge can be induced in a region below the fourth insulating layer of the channel. Thus, the spin diffusion length in the region below the fourth insulating layer of the channel can be lengthened. Accordingly, by lengthening the spin diffusion length, the corresponding voltage output can be increased, and further, by providing the upper electrode, an electric field or a magnetic field can be applied to the region below the fourth insulating layer of the channel. Therefore, the electric field or the magnetic field can be applied from the upper electrode to the spin flow or the current that flows between the magnetization free layer and the magnetization fixed layer, and thus it is possible to adjust the polarization direction of the spin. Also, when spin is transported through the channel, spin is scattered by the impurities in the channel. Accordingly, in the case of adjusting the carrier density of the channel, good characteristics can be obtained through the charge adjustment by the electric field, rather than the adjustment by ion injection.

Also, it is preferable that the fourth insulating layer is an oxide layer. The oxide layer can be easily formed on the channel.

Also, it is preferable that the first and second insulating layers comprise magnesium oxide. By using magnesium oxide as the first and second insulating layers, the spin injection efficiency is improved.

Also, it is preferable that a material of the magnetization free layer and the magnetization fixed layer is a metal selected from a group consisting of Ti, V, Cr, Mn, Co, Fe, and Ni, an alloy including one or more elements of the corresponding group, or an alloy including one or more elements selected from the group and one or more elements selected from a group consisting of B, C, and N. Since these materials are soft magnetic materials, it is possible to appropriately realize the function as the magnetization free layer. Also, since these materials are ferromagnetic materials having a high spin polarization rate, it is possible to appropriately realize the function as the magnetization fixed layer.

Also, it is preferable that the magnetization free layer and the magnetization fixed layer have a difference in coercive field due to the shape anisotropy. Accordingly, it is possible to omit an antiferromagnetic layer for producing the difference in coercive field.

Also, it is preferable that the coercive field of the magnetization fixed layer is greater than the coercive field of the magnetization free layer. Accordingly, it is possible to appropriately realize the functions of the magnetization fixed layer and the magnetization free layer in the spin transport device.

Also, it is preferable that the spin transport device according to an embodiment of the present invention further includes an antiferromagnetic layer formed on the magnetization fixed layer, wherein a magnetization direction of the magnetization fixed layer is pinned by the antiferromagnetic layer. As the antiferromagnetic layer is exchange-coupled to the magnetization fixed layer, it is possible to give a one-direction anisotropy in the magnetization direction of the magnetization fixed layer. In this case, the magnetization fixed layer having a high coercive field in one direction can be obtained in comparison to a case where the antiferromagnetic layer is not provided.

According to the present invention, a spin transport device having good characteristics can be provided.

BRIEF DESCRIPTION OF THE DRAWINGS

FIG. 4A is a top view illustrating a spin transport device according to the first embodiment of the invention, and FIG. 4B is an enlarged view of a region B in FIG. 4A;

FIG. 8 is a schematic diagram illustrating an example of carrier density distribution of a silicon channel;

DESCRIPTION OF TIE PREFERRED EMBODIMENTS

Figure 1:
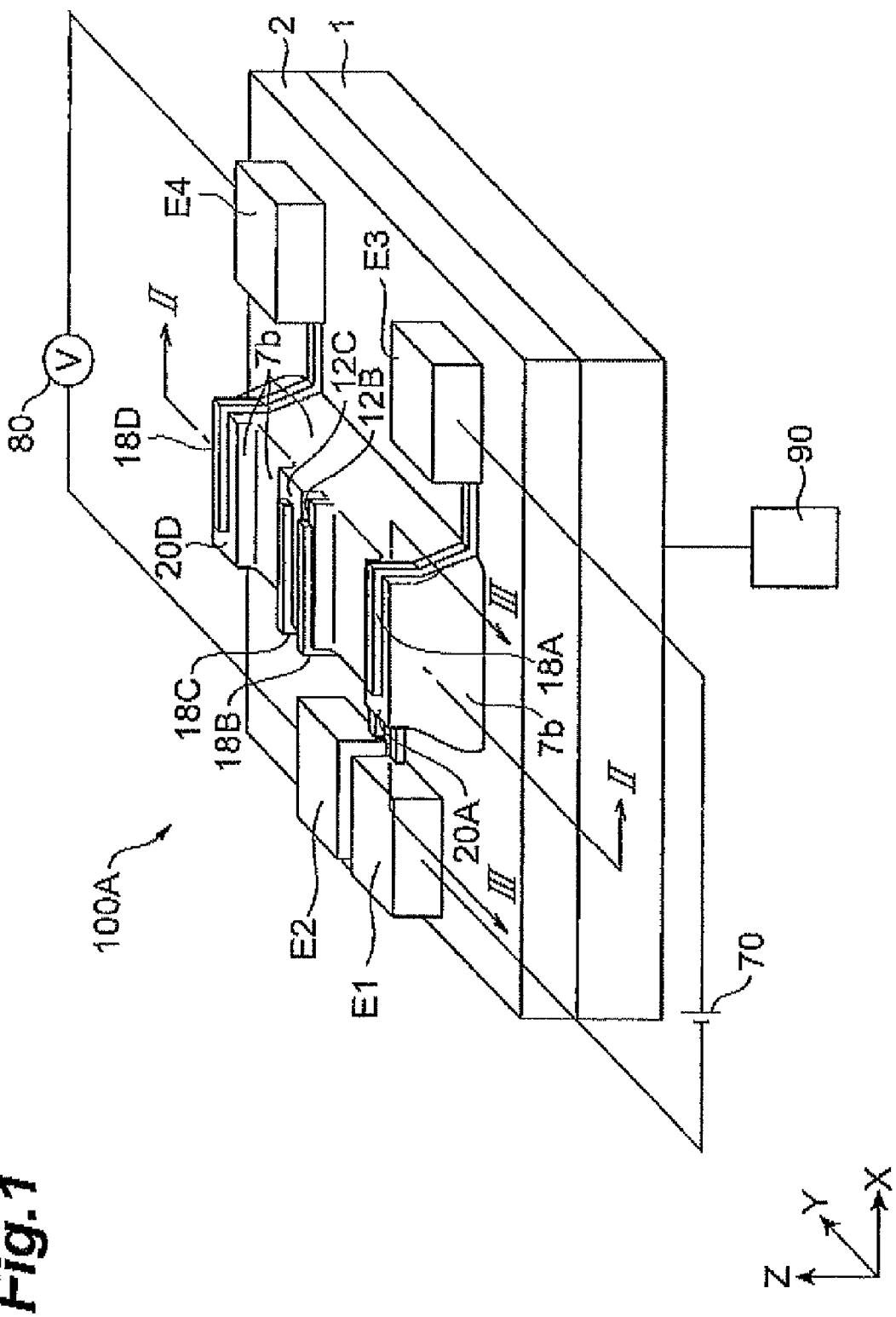
FIG. 1 is a perspective view illustrating a spin transport device according to a first embodiment of the invention.

Hereinafter, preferred embodiments of the present invention will be described in detail with reference to the accompanying drawings. In explaining the drawings, the same reference numerals are given to the same elements, and the duplicate explanation thereof will be omitted.

First Embodiment

Figure 2:
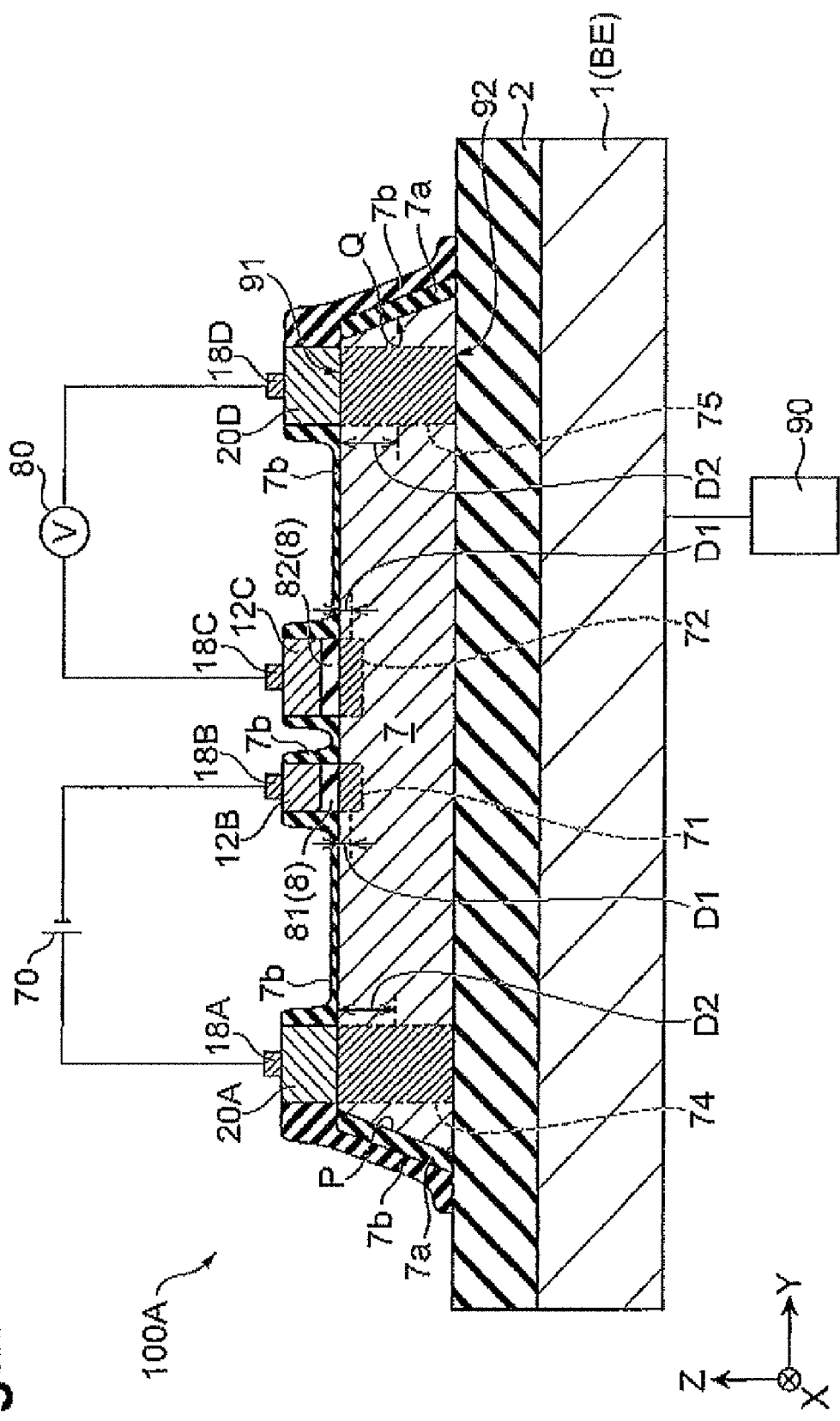
FIG. 2 is a sectional view taken along line II-II in FIG. 1.
Figure 3:
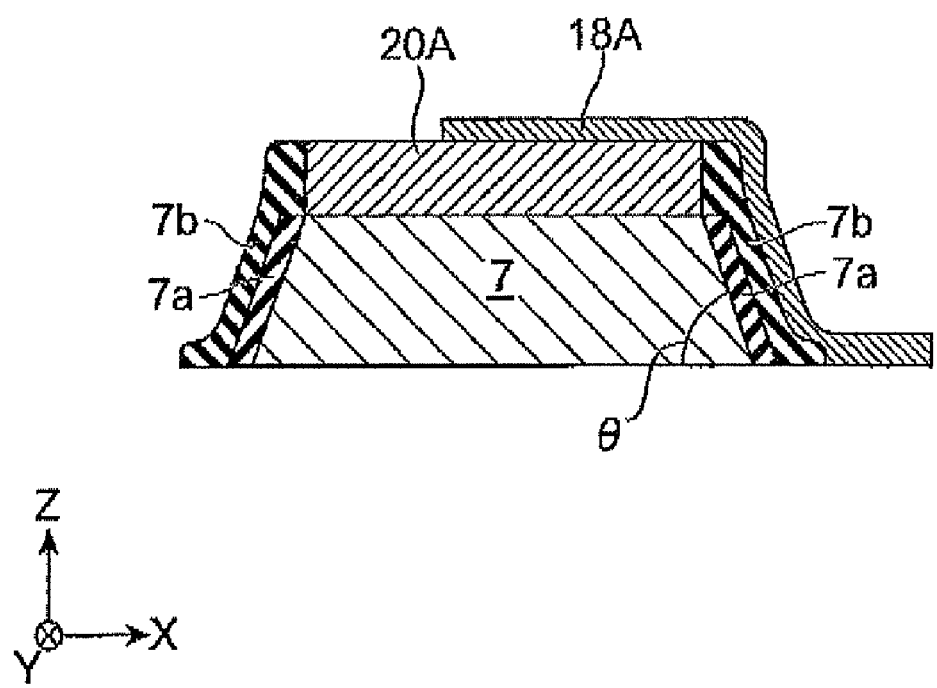
FIG. 3 is a sectional view taken along line in FIG. 1.

FIG. 1 is a perspective view of a spin transport device 100A. FIG. 2 is a sectional view taken along line II-II in FIG. 1, and FIG. 3 is a sectional view taken along line III-III in FIG. 1.

As illustrated in FIG. 2, a spin transport device 100A, in the case of using silicon as a semiconductor, mainly comprises a silicon substrate 1, a silicon oxide layer 2, a silicon channel 7, an insulating layer 8, a magnetization fixed layer 12B, a magnetization free layer 12C, a first electrode 20A and a second electrode 20D.

On the silicon substrate 1, the silicon oxide layer 2 and the silicon channel 7 are provided in this order. As the silicon substrate 1, the silicon oxide layer 2 and the silicon channel 7, for example, an SOI (Silicon On Insulator) substrate can be used.

The insulating layer 8 is an insulating film for using a tunnel magneto-resistance effect. The insulating layer 8 is provided on and in contact with the silicon channel 7. In an example as illustrated in FIG. 2, the insulating layer 8 is composed of a first insulating layer 81 and a second insulating layer 82. The magnetization fixed layer 12B is provided on the silicon channel 7 via the first insulating layer 81. The magnetization free layer 12C is provided on the silicon channel 7 via the second insulating layer 82. The first electrode 20A and the second electrode 20D are arranged on the silicon channel 7.

The silicon channel 7 serves as a layer in which the spin is transported and diffused. The silicon channel 7 has a main surface 91 and a back surface 92 that is opposite to the main surface 91. The silicon channel 7 includes, for example, silicon. To the silicon channel 7, impurities for giving one conduction type are added, and the whole silicon channel 7 has the same conduction type. For example, impurities in the case where the silicon channel 7 is of a p-type may be B, Al, Ga, In, or the like. For example, impurities in the case where the silicon channel 7 is of an n-type may be P, As, Sb, or the like.

The whole silicon channel 7 is determined by combining, a portion of the silicon channel 7 from the opposite portion of the first electrode 20A to the opposite portion of the magnetization fixed layer 12B, a portion of the silicon channel 7 from the opposite portion of the magnetization fixed layer 12B to the opposite portion of the magnetization free layer 12C, and a portion of the silicon channel 7 from the opposite portion of the magnetization free layer 12C to the opposite portion of the second electrode 20D. The whole channel 7 functions as the channel of electrons or spins. In the embodiment of the present invention, the silicon channel 7 is in the shape of a straight line. However, it is preferable that the silicon channel 7 is in the shape of a curve or bent.

Since the addition of impurities to the silicon channel 7 is selectively performed, there is a difference in carrier density inside the silicon channel 7. Specifically, carrier densities of a first region 71 of the silicon channel 7 including a contact surface with the first insulating layer 81, a second region 72 of the silicon channel 7 including a contact surface with the second insulating layer 82, a third region 74 of the silicon channel 7 including an opposite surface to the first electrode 20A, and a fourth region 75 of the silicon channel 7 including an opposite surface to the second electrode 20D are higher than an average carrier density of the whole silicon channel 7.

By connecting the magnetization fixed layer 12B and the first electrode 20A with a current source 70, current flows into the magnetization fixed layer 12B. By making current flow into the magnetization fixed layer 12B, electrons having spins whose direction corresponds to the direction of magnetization of the magnetization fixed layer 12B can be injected into the silicon channel 7. Also, a voltage output which occurs between the silicon channel 7 and the magnetization free layer 12C can be detected by a voltmeter 80 connected between the magnetization free layer 12C and the second electrode 20D.

According to the spin transport device 100A of this embodiment of the present invention, the first region 71 including the contact surface with the first insulating layer 81, the second region 72 including the contact surface with the second insulating layer 82, the third region 74 including the opposite surface to the first electrode 20A, and the fourth region 75 including the opposite surface to the second electrode 20D are provided in the silicon channel 7 so that they have carrier densities which are higher than the average carrier density of the whole silicon channel 7. Also, the magnetization fixed layer 12B is provided on the first insulating layer 81, and the magnetization free layer 12C is provided on the second insulating layer 82. Since the carrier density is relatively high in the first region 71, the second region 72, the third region 74, and the fourth region 75, respectively, as described above, their electric resistance is relatively low. Accordingly, the conductivity of the magnetization fixed layer 12B and the magnetization free layer 12C and the conductivity of the silicon channel 7 are easily adjusted, and thus the scattering of spin on the junction interface between the silicon channel 7 and the first insulating layer 81 or the second insulating layer 82 can be suppressed. Thus, current and spin from the magnetization fixed layer 12B are easily injected into the silicon channel 7 through the first insulating layer 81. Also, spin from the silicon channel 7 is easily injected into the magnetization free layer 12C through the second insulating layer 82. Accordingly, the high speed and energy saving of the spin transport device 100A can be promoted.

Further, since the carrier density is relatively low in regions of the silicon channel 7 except for the first region 71, the second region 72, the third region 74, and the fourth region 75, the electric resistance therein is relatively high. Accordingly, by using the corresponding region having a relatively high electric resistance as a spin transport path, the spin is easily transported. As a result, good spin transportation and electric resistance characteristics can be realized while the scattering of spin is suppressed.

Also, it is preferable that the maximum carrier density in each of the first region 71, the second region 72, the third region 74, and the fourth region 75 of the silicon channel 7 is set to $1 \times 10^{19}$ to $1 \times 10^{21}$ cm$^{-3}$. In the case of the corresponding carrier density, the Schottky barrier becomes thin on the interface between the magnetization fixed layer 12B and the silicon channel 7 via the first insulating layer 81, on the interface between the magnetization free layer 12C and the silicon channel 7 via the second insulating layer 82, on the interface between the first electrode 20A and the silicon channel 7, and on the interface between the second electrode 20D and the silicon channel 7, respectively, and thus the electric resistance in the spin flow or current path can be lowered effectively. Thus, the conductivity inconsistency between the magnetization fixed layer 12B or the magnetization free layer 12C and the silicon channel 7 can be reduced effectively. Accordingly, on the junction interface between the silicon channel 7 and the magnetization fixed layer 12B or the magnetization free layer 12C, which are made via the first insulating layer 81 or the second insulating layer 82, the scattering of spin can be suppressed effectively. Accordingly, the high speed and energy saving of the spin transport device 100A can be promoted effectively.

It is preferable that an average carrier density of the whole silicon channel 7 is set to $1 \times 10^{16}$ to $1 \times 10^{20}$ cm$^{-3}$. In this case, the electric resistance in regions of the silicon channel 7 except for the first region 71, the second region 72, the third region 74, and the fourth region 75 can be set to be relatively high, and thus the spin is easily transported. Also, it is more preferable that the average carrier density of the whole silicon channel 7 is set to $1 \times 10^{18}$ to $1 \times 10^{20}$ cm$^{-3}$. In this case, the spin in the regions of the silicon channel 7 except for the first region 71, the second region 72, the third region 74, and the fourth region 75 is easily transported.

It is preferable that there are gradients in carrier density inside each of the first region 71, the second region 72, the third region 74, and the fourth region 75 of the silicon channel 7.

The silicon channel 7 has, for example, a thickness of 100 nm. It is preferable that in each of the first region 71 and the second region 72 of the silicon channel 7, a depth D1, at which the carrier density becomes the maximum from the contact surface, is equal to or smaller than 10 nm, and in this case, better spin transportation is obtained.

It is preferable that in each of the third region 74 and the fourth region 75 of the silicon channel 7, a depth D2, at which the carrier density becomes at maximum from the opposite surface, is equal to or larger than 10 nm, and in this case, the high speed and energy saving of the spin transport device can effectively be promoted.

FIG. 8 is a schematic diagram illustrating an example of carrier density distribution of the silicon channel 7. In FIG. 8, the magnetization fixed layer 12B, the magnetization free layer 12C, the insulating layer 8, and the silicon channel 7 are illustrated. A curve 51 represents an example of the carrier density distribution of the silicon channel 7. Also, in FIG. 8, a depth D1, at which the carrier density becomes the maximum from the contact surface, in the first region 71 and the second region 72 is illustrated.

In the first region 71 and the second region 72 neighboring the connection interface between the insulating layer 8 and the silicon channel 7, there are gradients having maximum carrier density portions M, respectively. The carrier density of a portion L on the main surface 91 side of the silicon channel 7 is, for example, $1 \times 10^{18}$ cm$^{-3}$, and the carrier density of the maximum carrier density portion M is, for example, $1 \times 10^{20}$ cm$^{-3}$. The carrier density is gradually attenuated from the maximum portion M, and the carrier density in a portion N becomes, for example, $1 \times 10^{18}$ cm$^{-3}$.

Further, the carrier density has a gradually attenuating distribution from the portion N of the first region 71 and the second region 72 neighboring the contact interference between the insulating layer 8 and the silicon channel 7 to a portion O on the back surface 92 side. That is, the carrier density in the portion N of the silicon channel 7 is, for example, $1 \times 10^{18}$ cm$^{-3}$, and the carrier density in the portion O of the silicon channel 7 is, for example, $1 \times 10^{15}$ cm$^{-3}$.

In FIG. 8, the carrier density distribution in the first region 71 and the second region 72 is illustrated as an example. Also, the carrier density distribution in the third region 74 and the fourth region 75 have the same gradient. However, it is preferable that in the third region 74 and the fourth region 75, the depth D2 at which the carrier density becomes the maximum from the opposite surface is larger than the depth D1.

As illustrated in FIG. 3, the silicon channel 7 has a tilt portion on the side surfaces thereof, and its tilt angle θ is 50° to 60°. Here, the tilt angle θ is an angle between a bottom portion and a side surface of the silicon channel 7. In this case, the silicon channel 7 is formed by wet etching, and it is preferable that an upper surface of the silicon channel 7 is the (100) surface.

From the view point of suppressing the resistance increase and functioning as a tunnel insulating layer, it is preferable that the layer thickness of the first insulating layer 81 and the second insulating layer 82 as illustrated in FIG. 2 is equal to or smaller than 3 nm. Also it is preferable that in consideration of the thickness of monatomic layer, the layer thickness of the first insulating layer 81 and the second insulating layer 82 is equal to or larger than 0.4 nm. As the first insulating layer 81 and the second insulating layer 82, for example, magnesium oxide layer is used. By using magnesium oxide layer as the first insulating layer 81 and the second insulating layer 82, the spin injection efficiency is improved.

The magnetization fixed layer 12B and the magnetization free layer 12C includes a ferromagnetic material. The material of the magnetization fixed layer 12B and the magnetization free layer 12C is a metal selected from a group consisting of Ti, V, Cr, Mn, Co, Fe, and an alloy including one or more elements of the corresponding group, or an alloy including one or more elements selected from the group and one or more elements selected from a group consisting of B, C, and N. Since these materials are soft magnetic materials, it is possible to appropriately realize the function as the magnetization free layer 12C. Also since these materials are ferromagnetic materials having a high spin polarization rate, it is possible to appropriately realize the function as the magnetization fixed layer 12B.

As the first electrode 20A and the second electrode 20D, for example, non-magnetic metal having a low-resistance to Si, such as Al, is used.

Oxide layers 7a are formed on side surfaces of the silicon channel 7. Also, oxide layers 7b are formed on side surfaces of the silicon channel 7, the oxide layer 7a, the first insulating layer 81, the second insulating layer 82, the magnetization fixed layer 12B, the magnetization free layer 12C, the first electrode 20A, and the second electrode 20D. Further, oxide layers 7b are formed on portions of an upper surface of the silicon channel 7, on which the first electrode 20A, the second electrode 20D, and the insulating layer 8 are not provided. The oxide layer 7b, which is interposed between the first insulating layer 81 and the second insulating layer 82, is provided on the silicon channel 7.

The oxide layer 7b can protect the silicon channel 7 the first insulating layer 81, the second insulating layer 82, the magnetization fixed layer 12B, the magnetization free layer 12C, the first electrode 20A, and the second electrode 20D, and thus the deterioration thereof can be suppressed. The oxide layer 7b is a silicon oxide layer, for example. The silicon oxide layer is appropriate as a protection layer. Also, the silicon oxide layer can be easily formed on the silicon channel 7 comprised of silicon.

A wiring 18A is provided on the first electrode 20A and the oxide layer 7b (a tilt side surface of the silicon channel 7). In the same manner, a wiring 18B is provided on the magnetization fixed layer 12B and the oxide layer 7b (a tilt side surface of the silicon channel 7). In the same manner, a wiring 18C is provided on the magnetization free layer 12C and the oxide layer 7b (a tilt side surface of the silicon channel 7). In the same manner, a wiring 18D is provided on the second electrode 20D and the oxide layer 7b (a tilt side surface of the silicon channel 7). The wirings 18A to 18D are comprised of a conduction material such as Cu. By providing the wirings on the oxide layer 7b, the absorption of the spin of the silicon channel 7 can be suppressed. Also, by providing the wirings on the oxide layer 7b, current flow from the wirings to the silicon channel 7 can be suppressed, and thus the spin injection efficiency can be improved.

Electrode pads E1 to E4 for measurement are provided at end portions of the wirings 18A to 18D, respectively. The end portions of the wirings 18A to 18D and the electrode pads E1 to E4 for measurement are formed on the silicon oxide layer 2. The electrode pads E1 to E4 are comprised of a conduction material such as Au.

FIG. 4A is a top view illustrating a spin transport device according to the first embodiment of the invention, and FIG. 4B is an enlarged view of a region B in FIG. 4A. As illustrated in FIG. 4A, the silicon channel 7 is in the shape of a rectangular parallelepiped with its long axis laid on the Y-axis. As illustrated in FIG. 4B, the magnetization fixed layer 12B is provided below the wiring 18B, and the magnetization free layer 12C is provided below the wiring 18C. The magnetization fixed layer 12B and the magnetization free layer 12C are in the shape of a rectangular parallelepiped with their long axes laid on the X-axis. The width of the magnetization free layer 12C in Y direction is larger than the width of the magnetization fixed layer 12B in Y direction. The magnetization fixed layer 12B and the magnetization free layer 12C have a difference of a reverse magnetic field due to a difference of an aspect ratios in X and Y directions. As described above, the magnetization fixed layer 12B and the magnetization free layer 12C have a difference in coercive field clue to the shape anisotropy, and the coercive field of the magnetization fixed layer 12B is greater than the coercive field of the magnetization free layer 12C.

Hereinafter, the operation of the spin transport device 100A will be described. As illustrated in FIG. 1, the electrode pads E1 and E3 are connected to the current source 70, and current for detection flows through the magnetization fixed layer 12B. As the current for detection flows from the magnetization fixed layer 12B that is comprised of a ferromagnetic material to the non-magnetic silicon channel 7 through the insulating layer 8, electrons having spin whose direction corresponds to the magnetization direction of the magnetization fixed layer 12B are injected into the silicon channel 7. The injected spin is diffused toward the magnetization free layer side 12C. As described above, the current and spin flow through the silicon channel 7 is mainly made in Y direction. Also, by a mutual reaction of an electron spin in a magnetization direction of the magnetization free layer 12C that is changed by an external magnetic field and an electron spin in a portion that is in contact with the magnetization free layer 12C of the silicon channel 7, a voltage output occurs between the silicon channel 7 and the magnetization free layer 12C. This voltage output can be detected by the voltmeter 80 connected to the electrode pads E2 and E4.

Although the spin transport device of the first embodiment of the present invention has been described, the present invention is not limited thereto. For example, in the spin transport device 100A, the silicon substrate 1 may function as a lower electrode BE and a silicon oxide layer (a third insulating layer) 2 may function as a layer that insulates the silicon channel 7 and the lower electrode BE. That is, the spin transport device 100A may be provided with a third insulating layer and a lower electrode BE, so that the third insulating layer is provided on the lower electrode BE and the silicon channel 7 is provided on the third insulating layer. Also, a voltage source 90 is connected to the silicon substrate 1 that is the lower electrode BE. In this case, by applying a voltage to the lower electrode BE, charge can be induced in the back surface 92 side of the silicon channel 7. Thus, the spin diffusion length in the silicon channel 7 can be lengthened. Accordingly, by lengthening the spin diffusion length, the voltage output can be increased. Further, by providing the lower electrode BE, an electric field or a magnetic field can be applied from the back surface 92 side of the silicon channel 7. Accordingly, the electric field or the magnetic field from the lower electrode BE can be applied to the spin flow or the current that flows between the magnetization free layer 12C and the magnetization fixed layer 12B, and thus it is possible to adjust the polarization direction of the spin.

Figure 5:
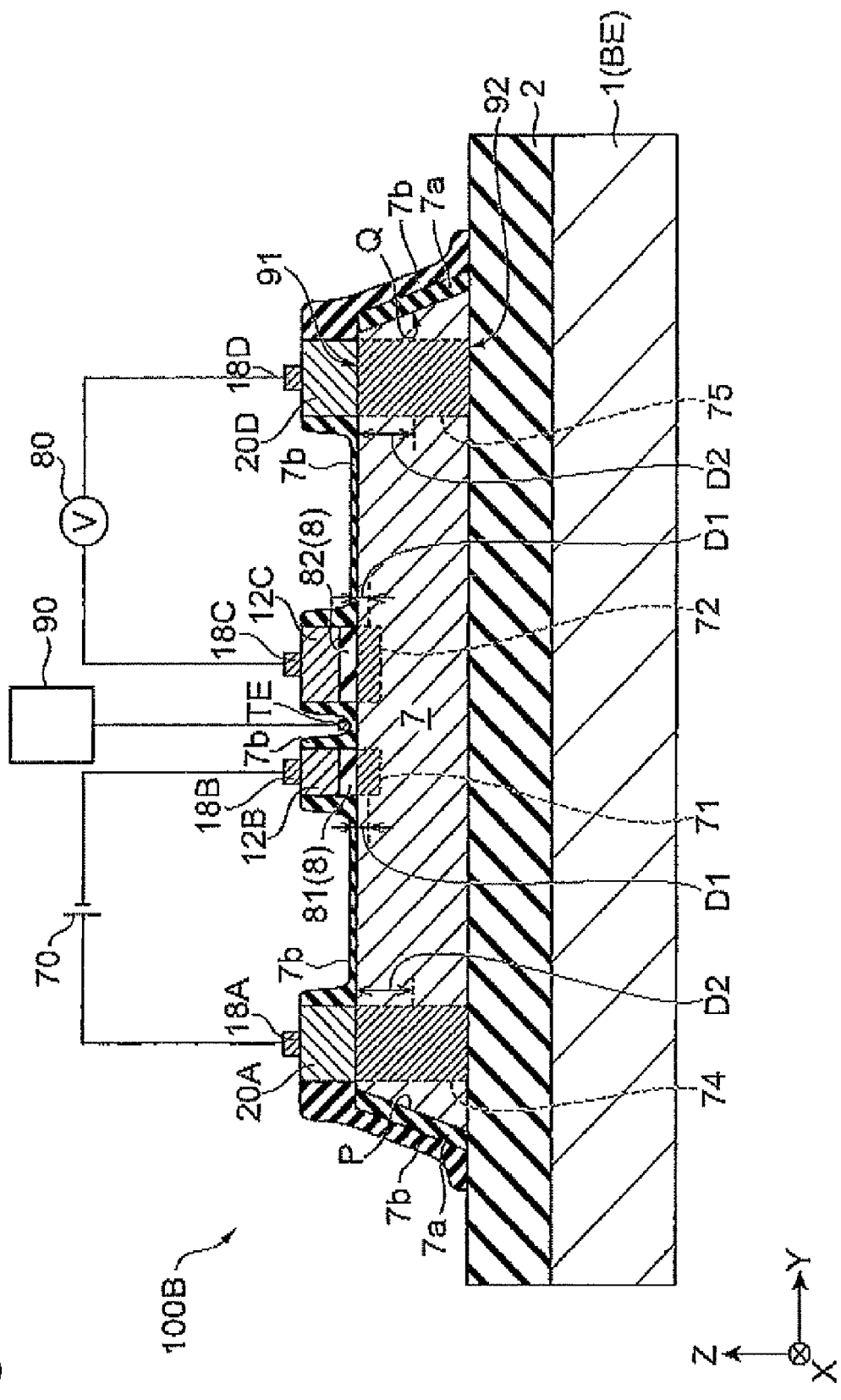
FIG. 5 is a sectional view illustrating a modified example of FIG. 2.

Also, instead of the lower electrode BE, an upper electrode TE may be used. FIG. 5 illustrates a modified example of FIG. 2. The spin transport device 100B as illustrated in FIG. 5 is obtained by adding the upper electrode TE to the spin transport device 100A as illustrated in FIG. 2. The upper electrode TE can be provided on the oxide layer 7b (a fourth insulating layer). By applying a voltage from the voltage source 90 connected to the upper electrode TE, charge can be induced between the magnetization fixed layer 12B and the magnetization free layer 12C, which are on the main surface 91 side of the silicon channel 7. Accordingly, the spin diffusion length in the silicon channel 7 can be lengthened. By lengthening the spin diffusion length, the corresponding voltage output can be increased. Further, by providing the upper electrode TE, an electric field or a magnetic field can be applied between the magnetization fixed layer 12B and the magnetization free layer 12C, which are on the main surface 91 side of the silicon channel 7. Accordingly, the electric field or the magnetic field from the upper electrode TB can be applied to the spin flow or the current that flows between the magnetization free layer 12C and the magnetization fixed layer 12B, and thus it is possible to adjust the polarization direction of the spin. Although it is exemplified that the silicon oxide layer is used as the third insulating layer and the fourth insulating layer, it is preferable that the third insulating layer and the fourth insulating layer are comprised of an insulating material such as an oxide layer or a nitride layer. For example, a silicon nitride layer can be used as the third insulating layer and the fourth insulating layer.

It is also possible to make the magnetization free layer 12C and the second electrode side 20D function to input current input and to make the magnetization fixed layer 12B and the first electrode 20A function to output a voltage. Also, instead of producing a difference in coercive field by the shape anisotropy in the magnetization fixed layer 12B and the magnetization free layer 12C, for example, an antiferromagnetic layer may be further provided on the magnetization fixed layer 12B. The antiferromagnetic layer functions to pin the magnetization direction of the magnetization fixed layer 12B. As the antiferromagnetic layer is exchange-coupled to the magnetization fixed layer, it is possible to give a one-direction anisotropy in the magnetization direction of the magnetization fixed layer. In this case, the magnetization fixed layer having a high coercive field in one direction can be obtained in comparison to a case where the antiferromagnetic layer is not provided. A material used for the antiferromagnetic layer is selected to match the material used for the magnetization fixed layer. For example, the antiferromagnetic layer may be made of an alloy that shows the antiferromagneticity through the use of Mn, and specifically, an alloy that includes at least one element selected from a group consisting of Mn, Pt, Ir, Fe, Ru, Cr, Pd, and Ni. Specifically, for example, the antiferromagnetic layer can be comprised of IrMn, PtMn, or the like.

Second Embodiment

Figure 6:
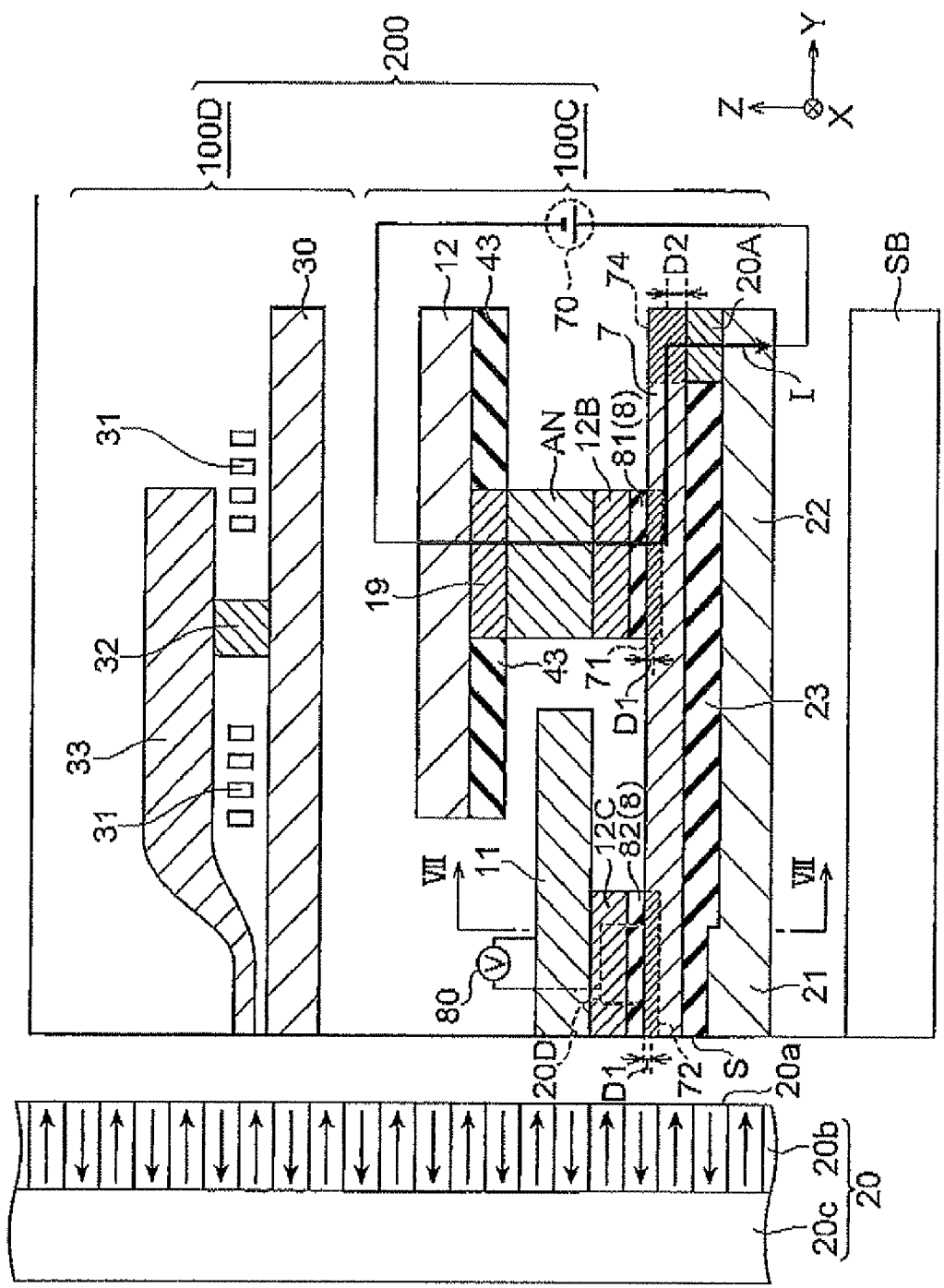
FIG. 6 is a sectional view illustrating a spin transport device according to a second embodiment of the invention.
Figure 7:
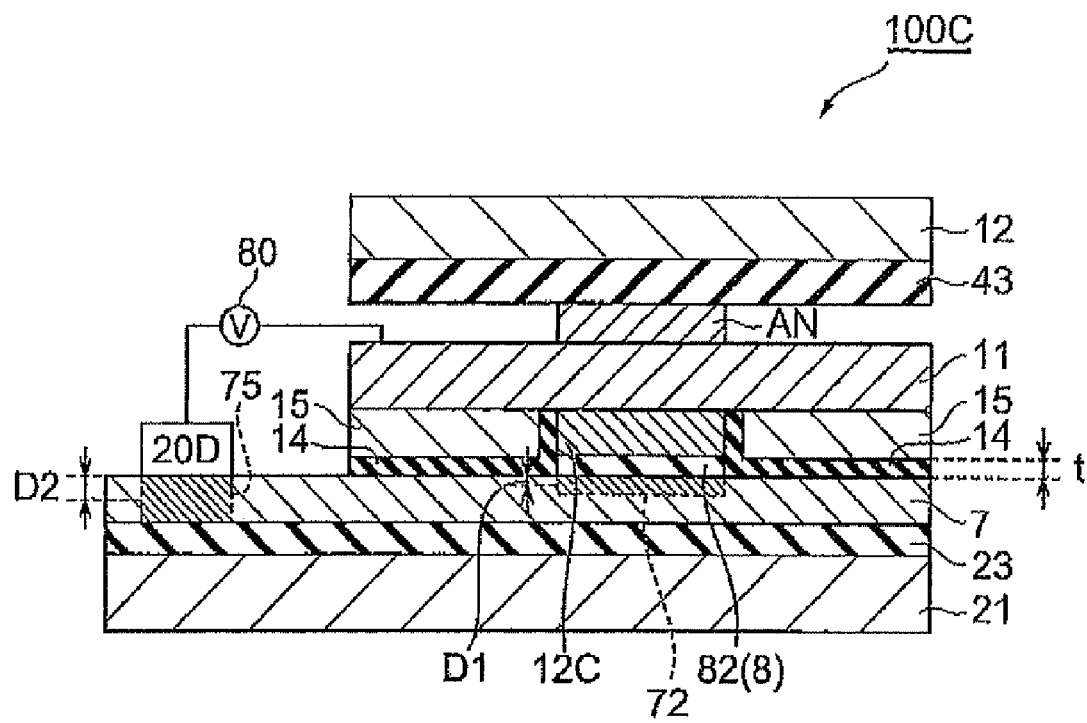
FIG. 7 is a sectional view taken along line VII-VII in FIG. 6.

In the second embodiment, a thin film magnetic recording/reproducing head 200 including a spin transport device 100C and a magnetic recording portion 100D will be described. FIG. 6 is a partial sectional view illustrating a thin film magnetic recording/reproducing head 200 according to the second embodiment, and FIG. 7 is a sectional view taken along line VI-VI in FIG. 6.

The thin film magnetic recording/reproducing head 200 performs a recording and reading operation of magnetic information in a position where its air bearing surface (medium opposite surface) S is arranged opposite to a recording surface 20a of a magnetic recording medium 20. The magnetic recording medium 20 includes a recording layer 20b having a recording surface 20a and a soft magnetic support layer 20c laminated on the recording layer 20b, and moves relative to the thin film magnetic recording/reproducing head 200 in a direction that is indicated as a Z direction in FIG. 6.

The spin transport device 100C is a magnetic sensor that reads records from the magnetic recording medium 20. The magnetic recording portion 100D performs recording on the magnetic recording medium 20. The spin transport device 100C and the magnetic recording portion 100D are provided on a substrate SB, and are covered with a non-magnetic insulating layer such as alumina or the like. As a substrate SB, an AlTiC substrate can be used, for example.

The magnetic recording portion 100D is provided on the spin transport device 100C. In the magnetic recording portion 100D, a contact portion 32 and a main magnetic pole 33 are provided on a return yoke 30 to form a path of magnetic flux. A thin film coil 31 is provided to surround the contact portion 32. If a recording current flows to the thin film coil 31, magnetic flux is emitted from the tip end of the main magnetic pole 33, and thus information can be recorded on the recording layer 20b of the magnetic recording medium 20 such as a hard disc or the like.

The spin transport device 100C comprises the silicon channel 7, the magnetization fixed layer 12B arranged on the silicon channel 7 via the first insulating layer 81, the magnetization free layer 12C arranged on the silicon channel 7 via the second insulating layer 82, and the first electrode 20A and the second electrode 20D arranged on the silicon channel 7. The carrier densities of the first region 71 of the silicon channel 7 including the contact surface with the first insulating layer 81, the second region 72 of the silicon channel 7 including the contact surface with the second insulating layer 82, the third region 74 of the silicon channel 7 including the opposite surface to the first electrode 20A, and the fourth region 75 of the silicon channel 7 including the opposite surface to the second electrode 20D are higher than the average carrier density of the whole silicon channel 7.

The whole silicon channel 7 is determined by combining, a portion of the silicon channel 7 from the opposite portion of the first electrode 20A to the opposite portion of the magnetization fixed layer 12B, a portion of the silicon channel 7 from the opposite portion of the magnetization fixed layer 12B to the opposite portion of the magnetization free layer 12C, and a portion of the silicon channel 7 from the opposite portion of the magnetization free layer 12C to the opposite portion of the second electrode 20D. The whole silicon channel 7 functions as the channel of electrons or spin. In the embodiment of the present invention, the silicon channel 7 is in an "L"-shape. However, the shape of the silicon channel 7 is not limited thereto, and for example, the silicon channel 7 is in the shape of a curve.

The spin transport device 100C is further comprises a first upper magnetic shield layer 11 and a first lower magnetic shield layer 21 oppositely interposed between the silicon channel 7 and the magnetization free layer 12C, a second upper magnetic shield layer 12 and a second lower magnetic shield layer 22 oppositely interposed between the silicon channel 7 and the magnetization fixed layer 12B, and an insulating layer 23 provided between the second lower magnetic shield layer 22 and the silicon channel 7.

The silicon channel 7 is a layer in which spin is accumulated by spin injection, and is provided on a plane that is formed by the first lower magnetic shield layer 21 and the insulating layer 23. To the silicon channel of the spin transport device 100C according to the second embodiment, the same carrier density distribution as that of the silicon channel of the spin transport device 100A according to the first embodiment can be applied, and the same depth can be applied to the first region 71, the second region 72, the third region 74, and the fifth region 75, respectively.

The magnetization free layer 12C is a layer for detecting an external magnetic field, and for keenly detecting the change of magnetization direction of the magnetic recording medium 20 or the like. The magnetization free layer 12C is arranged on the side into which the magnetic flux of the silicon channel 7 enters, that is, on the side of the air bearing surface S, on the upper surface of the silicon channel 7. By providing the magnetization free layer 12C in the neighborhood of the magnetic recording medium 20, it becomes possible to appropriately read the magnetic information from the magnetic recording medium 20.

The magnetization fixed layer 12B is a layer for injecting electrons having a specified spin into the silicon channel 7, and is arranged on the opposite side to the side into which the magnetic flux of the silicon channel 7 enters, that is, on the side that is far from the air bearing surface S, on the upper surface of the silicon channel 7.

The first electrode 20A is an electrode for making the current for detection flow to the magnetization fixed layer 12B. It is sufficient if the first electrode 20A is provided in a position which is connectable to the region 74 having the carrier density that is higher than the average carrier density of the whole silicon channel 7. In an example as illustrated in FIG. 6, the first electrode 20A is provided in the neighborhood of the insulating layer 23 on the opposite side to the air bearing surface S, on a lower surface of the silicon channel 7. In FIG. 6, the silicon channel 7 is electrically connected to the second lower magnetic shield layer 22 through the first electrode 20A. Accordingly, the second lower magnetic shield layer 22 provided below the first electrode 20A can be used as an electrode for making the current for detection flow to the magnetization fixed layer 12B. As the first electrode 20A, a metal material such as, for example, Cu, Cr, Al, or the like, can be used. In the case where the second lower magnetic shield layer 22 is not used as an electrode, the first electrode 20A can be provided, for example, on the opposite side to the air bearing surface S, on the silicon channel 7.

Next, with reference to FIG. 7, the cross-sectional shape in parallel to the X direction of the spin transport device 100C as illustrated in FIG. 6 will be described. The second electrode 20D is an electrode for detecting a voltage occurring between the silicon channel 7 and the first upper magnetic shield layer 11. It is sufficient if the second electrode 20D is provided in a position that is connectable to the silicon channel 7. In an example as illustrated in FIGS. 6 and 7, the second electrode 20D is provided on the side of the air bearing surface S on the silicon channel 7.

It is preferable that the second insulating layer 82 of the insulating layer 8 has the same thickness t as that of an insulating layer 14 to be described later. This is for making the thickness of the magnetization free layer 12C coincide with the thickness of a permanent magnet 15 to be described later. Thereby, it is possible to stabilize the magnetic pole structure of the magnetization free layer 12C more uniformly.

The insulating layer 14 is provided between the silicon channel 7 and the magnetization free layer 12C and the permanent magnet 15 to insulate the silicon channel 7, the magnetization free layer 12C, and the permanent magnet 15. As the insulating layer 14, a silicon oxide layer or the like can be used.

The permanent magnets 15 are arranged on both sides of the magnetization free layer 12C via the insulating layer 14. By applying a bias magnetic field to the magnetization free layer 12C using leakage magnetic flux from the permanent magnet 15, it becomes possible to stabilize (to form a one-axis structure of) the magnetic pole structure of the magnetization free layer 12C. Thereby, it becomes possible to suppress Barkhausen noise due to the movement of a magnetic domain wall.

In an example as illustrated in FIG. 6, an antiferromagnetic layer AN is used as a magnetization pinning method for the magnetization fixed layer 12B. The antiferromagnetic layer AN is provided on the magnetization fixed layer 12B.

A reference electrode 19 is a layer for electrically connecting the second upper magnetic shield layer 12 and the antiferromagnetic layer AN in order to make current flow to the magnetization fixed layer 12B as the second upper magnetic shield layer 12 is an electrode. At this time, if the antiferromagnetic layer AN does not exist, the reference electrode 19 becomes in contact with the magnetization fixed layer 12B. At this time, the reference electrode 19 suppresses the diffusion of atoms between the second upper magnetic shield layer 12 and the ferromagnetic layer AN or the magnetization fixed layer 12B, or the like. At this time, the present invention can be obtained so far as the second upper magnetic shield layer 12 is connected to the antiferromagnetic layer AN or the magnetization fixed layer 12B even without the reference electrode 19. As a material of the reference electrode 19, a metal material such as Cr or Al can be used.

The first upper magnetic shield layer 11 and the second upper magnetic shield layer 12 constitute the upper magnetic shield layer which intercepts the magnetism that enters from the outside, especially from the upper portion of the spin transport device 100C, into the magnetization free layer 12C and the magnetization fixed layer 12B, respectively. It is preferable that the first upper magnetic shield layer 11 is arranged closer to the silicon channel 7 in comparison to the second upper magnetic shield layer 12. It is also preferable that the first upper magnetic shield layer 11 is in contact with the magnetization free layer 12C. With respect to the magnetization fixed layer 12B, although a gap between the silicon channel 7 and the second upper magnetic shield layer 12 is disposed to become larger due to the antiferromagnetic layer AN, the reference electrode 19, or the like, a gap between the first upper magnetic shield layer 11 and the first lower magnetic shield layer 21 is easily narrowed in the magnetization free layer 12C by making the first upper magnetic shield layer 11 closer to the silicon channel 7 in comparison to the second upper magnetic shield layer 12.

As illustrated in FIG. 6, the first upper magnetic shield layer 11 is formed on the magnetization free layer 12C. On the other hand, the second upper magnetic shield layer 12 is formed on a layer structure that is comprised of the magnetization fixed layer 12B, the antiferromagnetic layer AN, and the reference electrode 19. Also, in the embodiment of the invention, the first upper magnetic shield layer 11 and the second upper magnetic shield layer 12 are independently provided. Thereby, the first upper magnetic shield layer 11 can be used as an electrode for the magnetization free layer 12C, and the second upper magnetic shield layer 12 can be used as an electrode for the magnetization fixed layer 12B.

The first lower magnetic shield layer 21 and the second lower magnetic shield layer 22 constitute the lower magnetic shield layer which intercepts the magnetism that enters from the outside, especially from the lower portion of the spin transport device 100C, into the magnetization free layer 12C and the magnetization fixed layer 12B. The first lower magnetic shield layer 21 is arranged closer to the silicon channel 7 in comparison to the second lower magnetic shield layer 22.

As materials of the first lower magnetic shield layer 21, the second lower magnetic shield layer 22, the first upper magnetic shield layer 11, and the second upper magnetic shield layer 12, for example, soft magnetic materials, such as an alloy including Ni and Fe, sendust, an alloy including Fe and Co, an alloy including Fe, Ca, and Ni, and the like, can be used.

The insulating layer 23 is provided between the silicon channel 7 and the first lower magnetic shield layer 21 or the second lower magnetic shield layer 22. The insulating layer 23 prevents the spin of electrons accumulated in the silicon channel 7 from flowing out to the sides of the first lower magnetic shield layer 21 and the second lower magnetic shield layer 22. The insulating layer 23 can be, for example, a silicon oxide layer.

The insulating layer 43 is formed on both ends of the reference electrodes 19. As the insulating layer 43, for example, a silicon oxide layer can be used. In this case, it is possible to omit the insulating layer 43.

Hereinafter, an example of the operation of the spin transport device 100C according to the second embodiment of the invention will be described with reference to FIGS. 6 and 7. In order to make current for detection flow to the magnetization fixed layer 12B, the second lower magnetic shield layer 22 and the second upper magnetic shield layer 12 are electrically connected to the current source 70. Also, the second electrode 20D and the first upper magnetic shield layer 11 are electrically connected to the voltmeter 80.

First, current I for detection flows through the magnetization fixed layer 12B of the spin transport device 100C. For example, as illustrated in FIG. 6, the current I for detection flows from the current source 70 to the second upper magnetic shield layer 12, the reference electrode 19, the antiferromagnetic layer AN, the magnetization fixed layer 12B, the silicon channel 7, the first electrode 20A, and the second lower magnetic shield layer 22 in order. If the current I for detection flows from the magnetization fixed layer 12B, which is comprised of a ferromagnetic material, to the silicon channel 7 as described above, spin whose direction corresponds to the magnetization direction of the magnetization fixed layer 12B is injected from the interface between the magnetization fixed layer 12B and the silicon channel 7 into the silicon channel 7. The spin is furthermore diffused from the magnetization fixed layer 12B side toward the magnetization free layer 12C side in the silicon channel 7. In accordance with the relative angle of the magnetization direction of the magnetization free layer 12C, which is changed by an external magnetic field, and the magnetization fixed layer 12B in a magnetization direction, different voltage outputs occur between the magnetization free layer 120 and the silicon channel 7. In this embodiment of the invention, the voltage occurring between the silicon channel 7 and the first upper magnetic shield layer 11 is detected by the voltmeter 80. By doing this, the spin transport device 100C can be used as an external magnetic field sensor.

According to the spin transport device 100C according to the second embodiment, the first region 71 including the contact surface with the first insulating layer 81, the second region 72 including the contact surface with the second insulating layer 82, the third region 74 including the opposite surface to the first electrode 20A, and the fourth region 75 including the opposite surface to the second electrode 20D are provided inside the silicon channel 7 so that the first to fourth regions 71, 72, 74, 75 have the carrier density that is higher than the average carrier density of the whole silicon channel. Also, the magnetization fixed layer 12B is provided on the first insulating layer 81, and the magnetization free layer 12C is provided on the second insulating layer 82. As described above, in the first region 71, the second region 72, the third region 74, and the fourth region 75, the carrier density is relatively high, and thus the electric resistance is relatively low. Accordingly, the conductivity of the magnetization fixed layer 12B and the magnetization free layer 12C and the conductivity of the silicon channel 7 are easily adjusted, and thus the scattering of spin on the junction interface between the silicon channel 7 and the first insulating layer 81 or the second insulating layer 82 can be suppressed. Thus, current and spin from the magnetization fixed layer 12B are easily injected into the silicon channel 7 through the first insulating layer 81. Also, spin from the silicon channel 7 is easily injected into the magnetization free layer 12C through the second insulating layer 82. Thereby, the high speed and energy saving of the spin transport device can be promoted.

Further, in the silicon channel 7, since the carrier density is relatively low in regions of the silicon channel 7 except for the region 71 that is in contact with the first insulating layer 81, the region 72 that is in contact with the second insulating layer 82, the region 74 that is in contact with the first electrode 20A, and the region 75 that is in contact with the second electrode 20D, the electric resistance therein is relatively high. Accordingly, by using the regions having a relatively high electric resistance as a spin transport path, the spin is easily transported. As a result, good spin transportation and electric resistance characteristics can be realized as the scattering of spin is suppressed.

As described above, although the first and second embodiments of the present invention have been described, the present invention is not limited thereto. Although it is exemplified that the channel comprised of silicon is used in the first and second embodiments, it is sufficient if the channel is comprised of a semiconductor material. For example, as a channel comprised of a semiconductor material, a compound semiconductor such as GaAs or the like can be used.

Hereinafter, although the present invention will be described in more detail based on examples 1 and 2, the present invention is not limited to the examples 1 and 2.

EXAMPLE 1

An SOI substrate composed of a silicon substrate, a silicon oxide layer (with a thickness of 200 nm), and a silicon layer (with a thickness of 100 nm) was prepared. An alignment mark was made on an SOI substrate by photolithography. A mask was formed by forming a silicon oxide layer on the silicon layer except for portions in which a magnetization fixed layer, a magnetization free layer, a first electrode, and a second electrode are formed in later processes.

First, a first ion injection was performed. Specifically, impurity ion injection for giving the n-type conductivity was selectively performed on portions of the silicon layer in which the first electrode and the second electrode are formed in later processes. P was used as the impurity. Then, a second ion injection was performed. Specifically, an impurity ion injection for giving the n-type conductivity was selectively performed on portions in the silicon layer in which the magnetization fixed layer and the magnetization free layer are formed in later processes. P was used as the impurity.

Then, adjustment of the electron density of the silicon layer was performed by diffusing impurities by annealing. The annealing temperature was 900° C. An average electron density of the whole silicon layer was set to $1\times10^{18}$ cm$^{-3}$. Also, the maximum electron density of each of the first region of the silicon layer including the contact surface with the first insulating layer, the second region of the silicon layer including the contact surface with the second insulating layer, the third region of the silicon layer including the opposite surface to the first electrode, and the fourth region of the silicon layer including the opposite surface to the second electrode to be formed in later processes was set to $1\times10^{20}$ cm$^{-3}$. Further, in each of the first and second regions, the electron density, which was distributed from a portion where the electron density was at maximum to the back surface of the silicon layer, was attenuated from $1\times10^{20}$ cm$^{-3}$ to $1\times10^{18}$ cm$^{-3}$.

Also, in each of the first and second regions of the silicon layer, the depth, at which the electron density became at maximum from the contact surface, was set to 10 nm. Also, in each of the third and fourth regions of the silicon layer, the depth, at which the carrier density became at maximum from the opposite surface, was set to 10 nm.

Thereafter, by cleaning, the adhered material, the organic material, and the oxide layer on the surface of the silicon layer, and the mask were removed. HP (Hydrofluoric acid) was used as a cleaning solution.

Then, a magnesium oxide layer (with a thickness of 0.8 nm) was formed on the silicon layer by an ultra-high vacuum E-beam evaporation method. Further, on the magnesium oxide layer, an iron layer (with a thickness of 10 nm), a titanium layer, and a tantalum layer were formed in order by an MBE method. In this case, the titanium layer and the tantalum layer were cap layers for suppressing the characteristic deterioration due to the oxidation of the iron layer that will be the magnetization fixed layer. Since the titanium layer and the tantalum layer were amorphous, they exerted a little influence upon the crystallization of the iron layer.

Then, the magnesium oxide layer, the iron layer, the titanium layer, and the tantalum layer were patterned by ion milling. The silicon layer was patterned by anisotropy wet etching using an aluminum oxide layer, the magnesium oxide layer, the iron layer, the titanium layer, the tantalum layer, and resist as a mask. Accordingly, a silicon channel having a tilt side surface was obtained. In this case, the size of the silicon channel was 23 µm×300 µm. Also, by oxidizing the side surface of the obtained silicon channel, a silicon oxide layer was formed.

Thereafter, the magnetization fixed layer and the magnetization free layer were obtained by patterning the iron layer by ion milling and chemical etching. The magnesium oxide layer in positions except for a position between the magnetization fixed layer and the magnetization free layer and the silicon channel were removed. Accordingly, the first insulating layer and the second insulating layer were obtained. The first electrode and the second electrode were obtained by forming an Al layer on one end side and the other end side of the exposed silicon channel.

Further, a silicon oxide layer was formed on side surfaces of the silicon oxide layer on the side wall of the silicon channel, the first insulating layer and the second insulating layer made of magnesium oxide, the magnetization fixed layer, the magnetization free layer, the first electrode, the second electrode, and portions of the upper surface of the silicon channel, on which the magnetization fixed layer, the magnetization free layer, the first electrode, and the second electrode were not formed.

Next, wirings were formed on the first electrode, the magnetization fixed layer, the magnetization free layer, and the second electrode. As the wirings, a laminated structure of Ta (with a thickness of 10 nm), Cu (with a thickness of 50 nm), and Ta (with a thickness of 10 nm) was used. Further, at end portions of the respective wirings, electrode pads were formed. As the electrode pad, a laminated structure of Cr (with a thickness of 50 nm) and Au (with a thickness of 150 nm) was used. By doing this, the spin transport device according to example 1, which has the same construction as the spin transport device 100A as illustrated in FIGS. 1 to 4, was prepared.

EXAMPLE 2

An adhered material on the surface was removed by cleaning the AlTiC substrate. A NiFe layer was formed on the AlTiC substrate with a thickness of 50 nm. By milling the NiFe layer, a lower magnetic shield layer was obtained. A silicon oxide layer was formed on the NiFe layer with a thickness of 50 nm. A portion of the silicon oxide layer was milled up to the NiFe layer, and a Cu layer and an Al layer were filled. The surface of the silicon oxide layer and the Al layer was polished by a chemical mechanical polishing (CMP) method so that the surface became smooth. After the polishing, the Cu layer and the Al layer functioned as the first electrode. On the smoothed silicon oxide layer and Al layer, a polycrystalline silicon layer was formed. A silicon channel was obtained by changing the polycrystalline silicon layer to a single crystalline silicon layer using pulse irradiation of a carbon dioxide laser. The laser irradiation temperature was set to a temperature at which the polycrystalline silicon was melted and changed to the single crystalline silicon.

In the same manner as in the example 1, twice ion injection, diffusion annealing, and cleaning were performed on the silicon layer. Further, a magnesium oxide layer, an iron layer, a titanium layer, and a tantalum layer were formed on the silicon layer and then patterned by ion milling or wet etching. Accordingly, a silicon channel, a magnetization fixed layer, and a magnetization free layer were obtained. Then, a second electrode was formed on the exposed silicon channel by removing a portion of the magnesium oxide. Further, an oxide layer was formed on the exposed silicon channel by wet etching.

Then, the titanium layer and the tantalum layer on the magnetization fixed layer were removed, and an antiferromagnetic layer was obtained by forming IrMn on the exposed iron layer. The NiFe layer was formed on the magnetization free layer as an electrode for wiring. The NiFe layer was formed on the antiferromagnetic layer as an electrode for wiring. By doing this a spin transport device according to example 2 having the same construction as the spin transport device 100C as illustrated in FIGS. 6 and 7 was prepared.

COMPARATIVE EXAMPLE

In the comparative example, except for the performing of ion injection once, a spin transport device was prepared by the same method as in example 1. By once ion injection, the average electron density of the whole silicon layer was set to $1 \times 10^{20}$ cm$^{-3}$.

(Evaluation of an Output Voltage)

With respect to the spin transport device obtained in examples 1 and 2 and the comparative example, an external magnetic field was applied, and the corresponding output voltage was measured. Specifically, by making current for detection from a current source flow to the magnetization fixed layer, spin was injected from the magnetization fixed layer into the silicon channel layer. Also, a voltage output based on the magnetization change of the magnetization free layer due to the external magnetic field was measured by the voltmeter.

Figure 9B:
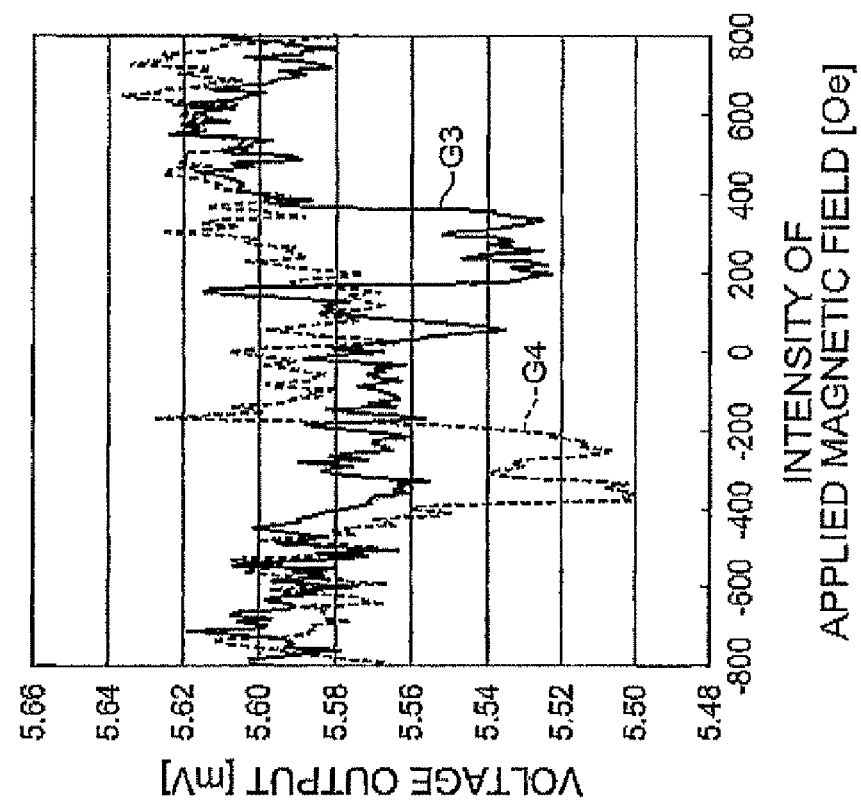
FIG. 9B is a graph illustrating the relation between the intensity [Oe] of an applied magnetic field and a voltage output [mV] in a spin transport device prepared in an example 1.
Figure 9A:
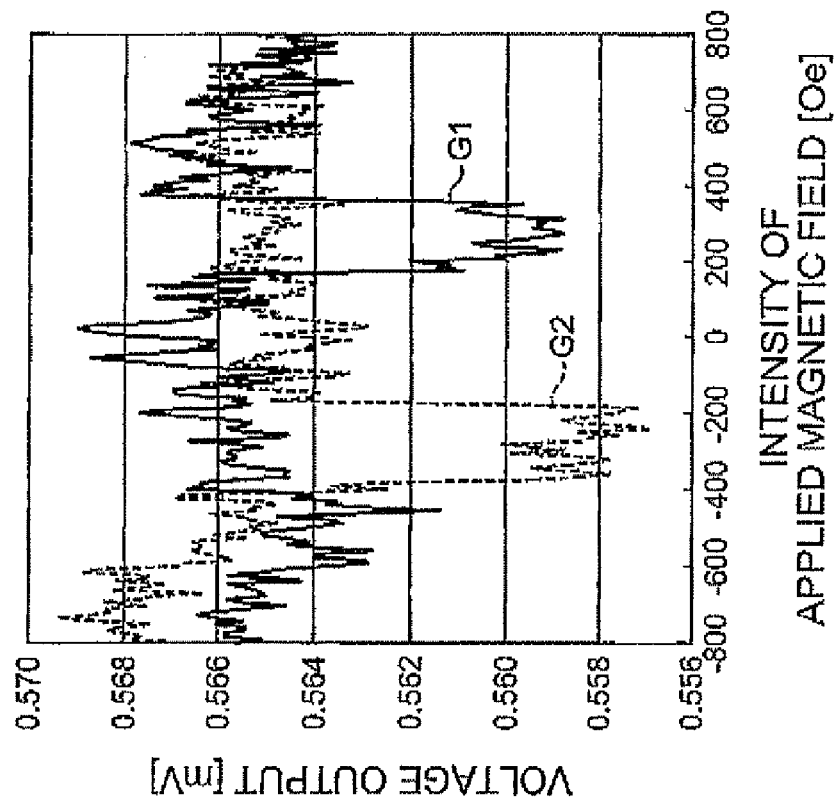
FIG. 9A is a graph illustrating the relation between the intensity [Oe] of an applied magnetic field and a voltage output [mV] in a spin transport device prepared in a comparative example.
Figure 10:
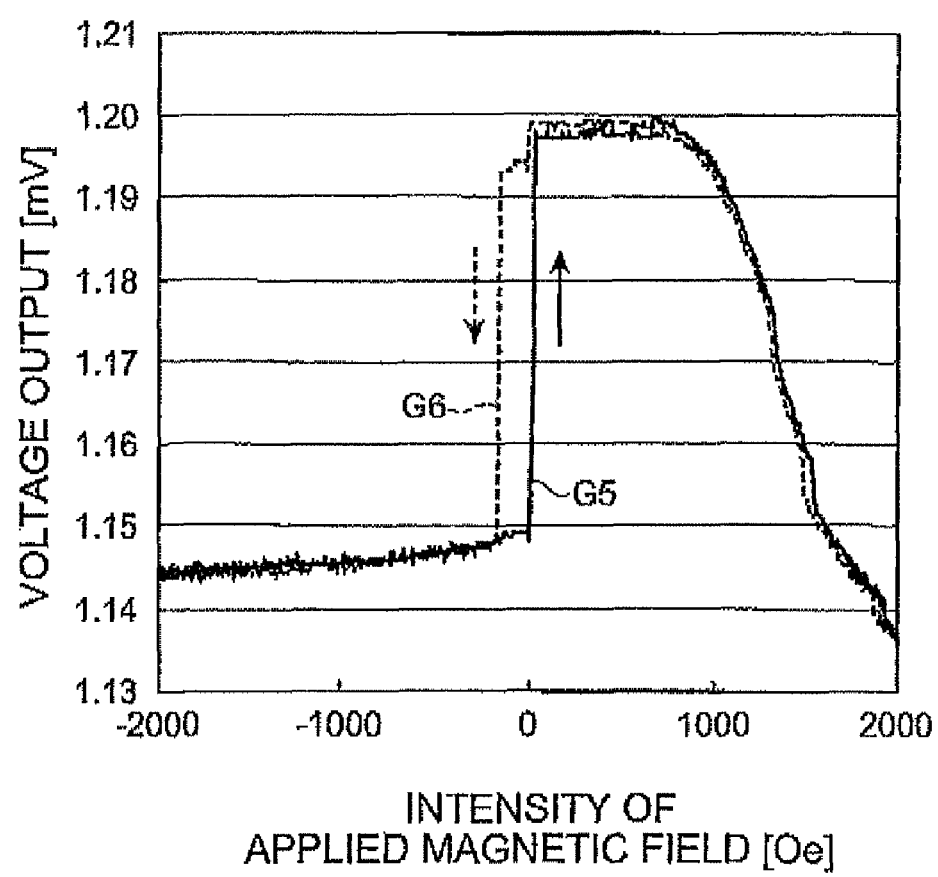
FIG. 10 is a graph illustrating the relation between the intensity [Oe] of an applied magnetic field and a voltage output [mV] in a spin transport device prepared in an example 2.

The results are illustrated in FIGS. 9A, 9B, and 10. FIGS. 9A, 9B, and 10 are graphs illustrating the relation between the intensity [Oe] of an applied magnetic field and a voltage output [mV]. FIG. 9A refers to the spin transport device in the comparative example, and FIG. 9B refers to the spin transport device in example 1. FIG. 10 refers to the spin transport device in example 2. In FIGS. 9A, 9B, and 10, "G1", "G3", and "G5" indicate cases in which the applied magnetic field is gradually strengthened, and "G2", "G4", and "G6" indicate cases in which the applied magnetic field is gradually weakened.

As illustrated as "G1" and "G2" in FIG. 9A, the voltage output of the spin transport device in the comparative example was about 0.008 mV (8 µV). By contrast, as illustrated as "G3" and "G4" in FIG. 9B, the voltage output of the spin transport device in example 1 was about 0.10 mV (100 µV).

The average electron density ($1 \times 10^{18}$ cm$^{-3}$) of the whole silicon layer in example 1 is 1/100 of the average electron density ($1 \times 10^{20}$ cm$^{-3}$) of the whole silicon layer in comparative example. That is, the electric resistance on the spin transport device in example 1 is 100 times higher than the electric resistance on the spin transport device in comparative example. As the electric resistance becomes higher, the spin is easily transported. In theory, if the electric resistance of the silicon becomes 100 times higher, it is expected that the voltage output becomes 100 times higher. However, in example 1, the voltage output was 10 times higher than the voltage output in comparative example. This is because the spin, injection became easy since the maximum electron density of the first region of the silicon layer including the contact surface with the first insulating layer, the second region of the silicon layer including the contact surface with the second insulating layer, the third region of the silicon layer including the opposite surface to the first electrode, and the fourth region of the silicon layer including the opposite surface to the second electrode was set to $1 \times 10^{20}$ cm$^{-3}$, but it was assumed that the spin was partially scattered by the high-density electrons.

Also, as illustrated as "G4" and "G5" in FIG. 10, the voltage output of the spin transport device in example 2 was about 0.05 mV (50 μV). At that time, as in example 1, comparative example, and example 2, the magnetization fixed layer and the magnetization free layer have different structures, and thus their reverse magnetic fields or waveforms differ from each other as in FIGS. 9A, 9B, and 10.

As described above, it can be known that the voltage output of the spin transport device in examples 1 and 2 is higher than the voltage output of the spin transport device in comparative example.

What is claimed is:

1. A spin transport device comprising:
    a channel comprised of a semiconductor material;
    a magnetization fixed layer arranged on the channel via a first insulating layer;
    a magnetization free layer arranged on the channel via a second insulating layer; and
    first and second electrodes arranged directly on and in contact with the channel;
    wherein carrier densities of a first region of the channel including a contact surface with the first insulating layer, a second region of the channel including a contact surface with the second insulating layer, a third region of the channel including an opposite surface to the first electrode, and a fourth region of the channel including an opposite surface to the second electrode are higher than an average carrier density of the whole channel.

2. The spin transport device according to claim 1, wherein a maximum carrier density in each of the first to fourth regions is set to $1 \times 10^{19}$ to $1 \times 10^{21}$ cm$^{-3}$.

3. The spin transport device according to claim 1, wherein the average carrier density of the whole channel is set to $1 \times 10^{16}$ to $1 \times 10^{20}$ cm$^{-3}$.

4. The spin transport device according to claim 1, wherein the average carrier density of the whole channel is set to $1 \times 10^{18}$ to $1 \times 10^{20}$ cm$^{-3}$.

5. The spin transport device according to claim 1, wherein in each of the first and second regions, a depth, at which the carrier density becomes maximum from the contact surface, is equal to or smaller than 10 nm.

6. The spin transport device according to claim 1, wherein in each of the third and fourth regions, a depth, at which the carrier density becomes maximum from the opposite surface, is equal to or larger than 10 nm.

7. The spin transport device according to claim 1, further comprising a third insulating layer and a lower electrode;
    wherein the third insulating layer is provided on the lower electrode, and
    wherein the channel is provided on the third insulating layer.

8. The spin transport device according to claim 1, further comprising:
    a fourth insulating layer provided on the channel between the first insulating layer and the second insulating layer; and
    an upper electrode provided on the fourth insulating layer.

9. The spin transport device according to claim 8, wherein the fourth insulating layer is an oxide layer.

10. The spin transport device according to claim 1, wherein the first insulating layer and the second insulating layer are comprised of magnesium oxide.

11. The spin transport device according to claim 1, wherein a material of the magnetization free layer and the magnetization fixed layer includes a metal selected from a group consisting of Ti, V, Cr, Mn, Co, Fe, and Ni, an alloy including one or more elements of the group, or an alloy including one or more elements selected from the group and one or more elements selected from a group consisting of B, C, and N.

12. The spin transport device according to claim 1, wherein the magnetization free layer and the magnetization fixed layer have a difference in coercive field due to shape anisotropy.

13. The spin transport device according to claim 1, wherein the magnetization fixed layer has the coercive field that is greater than that of the magnetization free layer.

14. The spin transport device according to claim 1, further comprising an antiferromagnetic layer formed on the magnetization fixed layer;
    wherein the antiferromagnetic layer pins a magnetization direction of the magnetization fixed layer.

* * * * *